United States Patent [19]

Maki et al.

[11] Patent Number: 5,807,493
[45] Date of Patent: Sep. 15, 1998

[54] MICROETCHING METHOD FOR COPPER OR COPPER ALLOY

[75] Inventors: Yoshiro Maki; Toshiko Nakagawa; Yasushi Yamada; Takashi Haruta; Maki Arimura, all of Amagasaki, Japan

[73] Assignee: MEC Co., Ltd., Amagasaki, Japan

[21] Appl. No.: 686,068

[22] Filed: Jul. 24, 1996

[30] Foreign Application Priority Data

Aug. 1, 1995 [JP] Japan ..................... 7-196637

[51] Int. Cl.$^6$ ................. B44C 1/22; C23F 1/00
[52] U.S. Cl. ............. 216/106; 252/79.1; 252/79.4
[58] Field of Search .............. 252/79.1, 79.3, 252/79.4; 216/106

[56] References Cited

U.S. PATENT DOCUMENTS

| | | | |
|---|---|---|---|
| 3,458,371 | 7/1969 | Borth et al. | 252/79.4 |
| 3,458,372 | 7/1969 | Borth et al. | 252/79.4 |
| 3,650,958 | 3/1972 | Shipley | 252/79.1 |
| 5,035,749 | 7/1991 | Haruta et al. | 134/2 |
| 5,206,052 | 4/1993 | Nakaso et al. | 427/97 |
| 5,435,860 | 7/1995 | Maki et al. | 148/269 |
| 5,439,783 | 8/1995 | Akiyama et al. | 430/331 |
| 5,496,590 | 3/1996 | Maki et al. | 427/388.1 |
| 5,532,094 | 7/1996 | Arimura et al. | 252/79.1 |

FOREIGN PATENT DOCUMENTS

| | | |
|---|---|---|
| 0 364 132 | 4/1990 | European Pat. Off. . |
| 0 428 383 | 5/1991 | European Pat. Off. . |
| 0 442 197 | 8/1991 | European Pat. Off. . |
| 0 551 112 | 7/1993 | European Pat. Off. . |
| 0 620 293 | 10/1994 | European Pat. Off. . |
| 0 627 499 | 12/1994 | European Pat. Off. . |
| 0 670 379 | 9/1995 | European Pat. Off. . |
| 1 621 516 | 10/1971 | Germany . |
| 4118764 | 12/1992 | Germany ............ 252/79.4 |
| 558037 | 6/1977 | U.S.S.R. ............ 252/79.4 |
| 1377903 | 6/1974 | United Kingdom . |

OTHER PUBLICATIONS

Chemical Abstracts, No. JP–53030435.
Chemical Abstracts, No., JP–52110235.

*Primary Examiner*—Roland Martin
*Attorney, Agent, or Firm*—Oblon, Spivak, McClelland, Maier & Neustadt, P.C.

[57] ABSTRACT

A microetching composition for copper or copper alloys comprising, (a) a cupric ion source, (b) an organic acid with an acid dissociation constant (pKa) of 5 or less, (c) a halide ion source, and (d) water. The composition can produce surfaces of copper or copper alloy exhibiting excellent adhesion to resins such as prepregs and resists and superior solderability. The composition can be very adaptable to the manufacture of printed wiring boards with highly integrated fine line patterns.

5 Claims, No Drawings

MICROETCHING METHOD FOR COPPER OR COPPER ALLOY

BACKGROUND OF THE INVENTION

1. Field of the Invention

The present invention relates to a microetching composition suitable for treating surfaces of copper or copper alloys.

2. Description of the Background Art

In the manufacture of printed-wiring boards, copper surfaces are polished prior to coating such surfaces with an etching resist or a solder resist to improve adhesion of these resists to the copper surfaces. Mechanical cleaning using a buffing or scrubbing machine or chemical cleaning, known as microetching, are used for roughening the copper surfaces. The microetching is more popular for treating substrates with fine line patterns. The copper surface is etched as deeply as 1–5 μm by a microetching treatment.

The microetching is also applied to remove oxidized films on the surface of copper prior to a solder leveling process or prior to mounting of electronic parts in order to improve solderability. An aqueous solution containing sulfuric acid and hydrogen peroxide as major components or an aqueous solution containing persulfate as a major component is used for the microetching.

As the circuit density of printed wiring boards become higher, conventional heat curable-type solder resists are being replaced by UV curable-type solder resists which are superior in forming fine line patterns. The characteristics of the UV curable-type solder resists in adhering to copper surfaces, however, are weaker than those of conventional solder resists. The copper surfaces obtained by conventional microetching therefore exhibit insufficient adhesion to these UV curable solder resists. Resist films may be peeled or may swell during the subsequent steps of gold plating, solder leveling, or electronic part mounting.

In addition, the solderability of copper surfaces obtained by conventional microetching is insufficient for the solder leveling process for printing wiring boards which use an increasing number of pads for mounting parts. Soldering failures sometimes occur.

Therefore, development of a microetching agent which can produce roughened surfaces of copper or copper alloy with adequately deep irregularities exhibiting excellent adhesion of solder resists and the like has been desired.

SUMMARY OF THE INVENTION

The present inventors have conducted extensive studies and have found that a composition comprising cupric ion, a specific organic acid, and a halide ion can exhibit a superior microetching effect and produce excellently roughened copper or copper alloy surfaces.

Accordingly, an object of the present invention is to provide a microetching composition for copper or copper alloys comprising, (a) a cupric ion source, (b) an organic acid with an acid dissociation constant (pKa) of 5 or less, (c) a halide ion source, and (d) water.

Other objects, features and advantages of the invention will hereinafter become more readily apparent from the following description.

DETAILED DESCRIPTION OF THE INVENTION AND PREFERRED EMBODIMENTS

The cupric ion source compound used in the composition of the present invention as the component (a) has the function of an oxidizing agent to oxidize metals such as copper or the like. The use of the cupric ion source compound as the oxidizing agent ensures that the microetching composition exhibits an adequate etching speed and constantly produces deep irregularities on the surface of the copper. A cupric salt of an organic acid, cupric chloride, cupric bromide, and cupric hydroxide are given as examples of the cupric ion source compound. The organic acid for forming the cupric salt is preferably selected from organic acids having a pKa of 5 or less which are hereinafter discussed, but not limited to these. Two or more cupric ion source compounds may be used together.

The content of the cupric ion source compounds in the composition of the present invention in terms of the amount of metallic copper is 0.01 to 20% by weight (hereinafter simply indicated as "%"), and preferably 0.1 to 10%. The etching is slow if this content is too small. If the content is too great, it is difficult to dissolve the cupric ion source compounds in the solution, resulting in production smudges on the treated copper surface.

The organic acid with an acid dissociation constant (pKa) of 5 or less used in the present invention as the component (b) is incorporated to dissolve the copper oxidized by the cupric ion source and to adjust the pH of the microetching agent solution. If the pKa of the organic acid is greater than 5, the solution cannot sufficiently dissolve the copper oxide. Given as examples of an organic acid with a pKa of 5 or less are saturated aliphatic acids, such as formic acid, acetic acid, propionic acid, butyric acid, valeric acid, and caproic acid; unsaturated aliphatic acids, such as acrylic acid, crotonic acid, and iso-crotonic acid; saturated aliphatic dicarboxylic acids, such as oxalic acid, malonic acid, succinic acid, glutaric acid, adipic acid, and pimelic acid; unsaturated aliphatic dicarboxylic acids such as maleic acid; aromatic carboxylic acids, such as benzoic acid, phthalic acid, and cinnamic acid; hydroxyl carboxylic acids, such as glycolic acid, lactic acid, malic acid, and citric acid; carboxylic acids with substituents, such as sulfamic acid, β-chloropropionic acid, nicotinic acid, ascorbic acid, hydroxyl pivalic acid, and levulinic acid; as well as their derivatives. Two or more these organic acids may be used together.

The amount of organic acids in the composition of the present invention is preferably in the range of 0.1–30%. If this amount is too small, the composition cannot sufficiently dissolve copper oxide and may produce smudges on the treated surfaces. Also, it is difficult to achieve a stable etching speed. If the amount of the organic acids is too great, the solution stability of copper is lowered. Re-oxidation may occur on the surface of copper.

Halide ions used in the composition of the present invention as the component (c) are to assist the dissolving of the copper and to ensure production of copper surfaces with superior adhesiveness and solderability. Fluoride ion, chloride ion, bromide ion, or the like can be used as the halide ion. These are added to the composition as a compound which can be dissociated into a halide ion in a solution, such as hydrochloric acid, hydrobromic acid, sodium chloride, calcium chloride, potassium chloride, ammonium chloride, potassium bromide, copper chloride, copper bromide, zinc chloride, iron chloride, and tin bromide. Two or more halide ion source compounds may be used. Cupric chloride, for example, can be used as both the cupric ion source compound of component (a) and the halide ion source compound of component (c).

The amount of halide ion in the composition of the present invention is preferably in the range of 0.01–20%. If outside this range, it is difficult to obtain copper surfaces with excellent adhesiveness to resins and superior solderability.

In addition to the above essential components, the microetching composition of the present invention may be formulated with additives such as an organic acid salt of sodium, potassium, or ammonium to reduce fluctuation in the pH during the etching treatment; a complexing agent such as ethylenediamine, pyridine, aniline, ammonia, monoethanolamine, diethanolamine, triethanolamine, and N-methyldiethanol-amine to improve the solution stability of copper; and other various additives for producing copper surfaces with excellent adhesiveness and solderability.

The microetching agent composition of the present invention can be prepared by adding the above-mentioned components in the proportions described above to water (d) and blending the mixture. There are no specific limitations to the method of addition. The components may be added either all at one time or separately in any arbitrary order. The water used is preferably ion exchanged.

There are no specific limitations to the method for using the surface treating composition of the present invention. Examples of such a method include a method of spraying the composition onto the surfaces of copper or copper alloy to be treated, a method of immersing the copper or copper alloy in the composition, and the like. If necessary, air may be bubbled into the composition to oxidize cuprous ion which has formed therein by etching of the copper or copper alloy to cupric ion. The microetching agent solution after use can be easily treated for disposal by simple conventional methods such as neutralization and treatment with a polymer flocculation agent.

In order to further improve the adhesiveness between the copper or copper alloy surface and a resin, it is possible to further treat the surfaces treated with the microetching composition of the present invention with an aqueous solution of an azole compound or an alcoholic solution according, for example, to U.S. Pat. No. 3,645,772. An oxidizing treatment called brown oxide or black oxide treatment may be applied after the microetching of the present invention.

The microetching composition of the present invention can be widely used for chemical cleaning or the like of copper or copper alloys. The resulting surfaces of copper or copper alloy have adequate irregularities with deep convex and concave portions so that they can exhibit not only excellent adhesion to resins, such as prepregs, solder resists, dry film resists, and electrodeposition resists, but also superior solderability. Because of this, the microetching composition is particularly useful for the manufacture of various printed-wiring boards, including those for pin grid array (PGA) or ball grid array (BGA), as well as for the surface treatment of lead frames used for integrated circuit boards.

For example, in the manufacture of copper-clad laminates for printed-wiring boards, surfaces exhibiting excellent adhesion to prepregs and superior etching performance in the patterning operation can be produced by roughening copper foils using the microetching composition of the present invention. Further, in the manufacture of multi-layered printed-wiring boards, the use of the microetching composition for roughening copper surfaces of inner layers produces surfaces which exhibit not only excellent adhesion to prepregs, but also a superb effect in preventing formation of pink rings. Because the surfaces treated with the microetching composition of the present invention are less glossy than the surfaces treated with conventional sulfuric acid-hydrogen peroxide etchants, this has the effect, in addition to increased adhesion to resins, whereby diffusion of light during irradiation is small and resolution of photosensitive resins is thereby increased when the photosensitive resins are coated or laminated.

Other features of the invention will become apparent in the course of the following description of the exemplary embodiments which are given for illustration of the invention and are not intended to be limiting thereof.

EXAMPLES

Examples 1–4

Microetching solutions of the present invention were prepared by dissolving the components listed in Table 1 in water. Double-sided, copper-clad laminates for printed-wiring boards (FR-4) were treated by spraying the microetching solution at 40° C. for 60 seconds. A solder resist (PSR-4000™, a product of Taiyo Ink Manufacturing Co., Ltd.) was applied to the surface, followed by exposure to light, development, and post-curing to obtain various patterns. Next, a no-clean post flux (AP-4626™, a product of MEC Co., Ltd.) was applied and soldering was carried out using an automatic wave soldering machine. The conditions of the solder resist were observed. A post-cure time shorter than the standard post time was applied while using a post flux with a concentration three times as high as the standard post flux concentration to allow the solder resist to be easily peeled off.

Copper-clad laminates for printed-wiring boards (FR-4) having a number of round pads with a diameter of 1 mm, with other areas being covered with a solder resist, were treated by spraying the microetching solutions listed in Table 1 at 40° C. for 60 seconds. After application of a solder leveler flux (W-2556™, a product of MEC Co., Ltd.), the boards were soldered using a horizontal soldering leveler to observe the soldering performance which is indicated by the proportion of soldered pads. The results are shown in Table 2.

Comparative Examples 1–4.

Microetching solutions shown in Table 1 were prepared and evaluated in the same manner as in Examples 1–4. The results are shown in Table 2.

TABLE 1

|  |  | (%) |
|---|---|---|
| Example 1 | Cupric chloride dihydrate | 4 |
|  | Acetic acid (pKa = 4.56) | 5 |
|  | Ion-exchanged water | Balance |
| Example 2 | Cupric formate | 5 |
|  | Formic acid (pKa = 3.55) | 2 |
|  | Ammonium chloride | 8 |
|  | Ion-exchanged water | Balance |
| Example 3 | Cupric acetate | 5 |
|  | Acrylic acid (pKa = 4.26) | 20 |
|  | Sodium chloride | 4 |
|  | Ethylenediamine | 1 |
|  | Ion-exchanged water | Balance |
| Example 4 | Cupric bromide | 2 |
|  | Glycolic acid (pKa = 3.63) | 10 |
|  | Ion-exchanged water | Balance |
| Comparative Example 1 | Sulfuric acid | 10 |
|  | 35% Hydrogen peroxide solution | 5 |
|  | Ion-exchanged water | Balance |
| Comparative Example 2 | Sodium persulfate | 10 |
|  | Sulfuric acid | 1 |
|  | Ion-exchanged water | Balance |
| Comparative Example 3 | Cupric chloride | 4 |
|  | Hydrochloric acid | 5 |

TABLE 1-continued

|  |  | (%) |
|---|---|---|
| Comparative Example 4 | Ion-exchanged water | Balance |
|  | Cupric chloride | 4 |
|  | Uric acid (pKa = 5.61) | 0.5 |
|  | Ion-exchanged water | Balance |

TABLE 2

|  | Soldering performance (%) | Swelling or Peeling of solder resist |
|---|---|---|
| Example 1 | 100 | Completely absent |
| Example 2 | 97.4 | Completely absent |
| Example 3 | 96.6 | Completely absent |
| Example 4 | 95.3 | Completely absent |
| Comparative Example 1 | 60.2 | Present |
| Comparative Example 2 | 54.3 | Present |
| Comparative Example 3 | 80.8 | Slightly present |
| Comparative Example 4 | 50.0 | Present |

The etching performance (etching speed) using the microetching composition of Comparative Example 3 became unstable and the treatment could not uniformly proceed when the composition was repeatedly used for the treatment of copper-clad laminates. The copper surface treated by the microetching composition of Comparative Example 4 had crystal-like smudges. In addition, the surface exhibited poor glossiness after soldering.

As illustrated above, the microetching composition of the present invention can produce surfaces of copper or copper alloy exhibiting excellent adhesion to resins such as prepregs and resists, and superior solderability. Because the resulting surface is less glossy than the surface obtained by conventional microetching, such a surface can improve resolution in development when used as a substrate for a photosensitive resin and can reduce errors by an automatic optical inspector (AOI) when the circuit in the printed wiring board is inspected by the AOI. The microetching composition of the present invention therefore can be very adaptable to the manufacture of printed wiring boards with highly integrated fine line patterns.

Obviously, numerous modifications and variations of the present invention are possible in light of the above teachings. It is therefore to be understood that, within the scope of the appended claims, the invention may be practiced otherwise than as specifically described herein.

What is claimed is:

1. A method for microetching, comprising;
    contacting a surface of copper or a copper alloy with a microetching composition consisting essentially of
    (a) a cupric ion source,
    (b) an organic acid with an acid dissociation constant (pKa) of 5 or less,
    (c) a halide ion source, and
    (d) water.

2. The method for microetching acording to claim 1, wherein the cupric ion source is a compound selected from the group consisting of a cupric salt of an organic acid, cupric chloride, cupric bromide and cupric hydroxide.

3. The method for microetching according to claim 2, wherein said organic acid is selected from the group consisting of formic acid, acetic acid, propionic acid, butyric acid, valeric acid, caproic acid, acrylic acid, crotonic acid, iso-crotonic acid, oxalic acid, malonic acid, succinic acid, glutaric acid, adipic acid, pimelic acid, maleic acid, benzoic acid, phthalic acid, cinnamic acid, glycolic acid, lactic acid, malic acid, citric acid, sulfamic acid, β-chloropropionic acid, nicotinic acid, ascorbic acid, hydroxyl pivalic acid and levulinic acid.

4. The method for microetching according to claim 1, wherein said organic acid with an acid dissociation constant (pKa) of 5 or less is selected from the group consisting of formic acid, acetic acid, propionic acid, butyric acid, valeric acid, caproic acid, acrylic acid, crotonic acid, iso-crotonic acid, oxalic acid, malonic acid, succinic acid, glutaric acid, adipic acid, pimelic acid, maleic acid, benzoic acid, phthalic acid, cinnamic acid, glycolic acid, lactic acid, malic acid, citric acid, sulfamic acid, β-chloropropionic acid, nicotinic acid, ascorbic acid, hydroxyl pivalic acid and levulinic acid.

5. The method for microetching according to claim 1, wherein the halide ion source is a compound selected from the group consisting of hydrochloric acid, hydrobromic acid, sodium chloride, calcium chloride, potassium chloride, ammonium chloride, potassium bromide, copper chloride, copper bromide, zinc chloride, iron chloride, and tin bromide.

* * * * *

UNITED STATES PATENT AND TRADEMARK OFFICE
CERTIFICATE OF CORRECTION

PATENT NO. : 5,807,493
DATED : SEPTEMBER 15, 1998
INVENTOR(S) : YOSHIRO MAKI ET AL.

It is certified that error appears in the above-identified patent and that said Letters Patent is hereby corrected as shown below:

Column 6, line 13, "acording" should read --according--.

Signed and Sealed this

Twenty-sixth Day of January, 1999

Attest:

Attesting Officer

*Acting Commissioner of Patents and Trademarks*